United States Patent
Hirose

[11] Patent Number: 5,151,928
[45] Date of Patent: Sep. 29, 1992

[54] METHOD AND APPARATUS FOR GENERATING X RAYS

[75] Inventor: Hideo Hirose, Wako, Japan
[73] Assignee: Shimadzu Corporation, Kyoto, Japan
[21] Appl. No.: 747,332
[22] Filed: Aug. 20, 1991

[30] Foreign Application Priority Data
Aug. 31, 1990 [JP] Japan .................. 2-231785

[51] Int. Cl.⁵ .................. H01J 35/26; G21G 4/00
[52] U.S. Cl. .................. 378/119; 378/34; 378/122; 378/143; 250/483.1; 250/492.2; 372/5
[58] Field of Search .......... 378/119, 34, 122, 143; 250/483.1, 492.2; 372/5

[56] References Cited
U.S. PATENT DOCUMENTS
4,866,517 9/1989 Mochizuki et al. .......... 378/119
4,896,341 1/1990 Forsyth et al. .......... 378/34
4,955,045 9/1990 Friede et al. .......... 378/122
5,089,711 2/1992 Morsell et al. .......... 250/492.3

Primary Examiner—Constantine Hannaher
Assistant Examiner—Kim-Kwok Chu
Attorney, Agent, or Firm—Wegner, Cantor, Mueller & Player

[57] ABSTRACT

Method and apparatus for generating X rays by laser impingement on a target in a vacuum enclosure to generate plasma, wherein the target comprises a first film made of a suitable metal and a second film made of an X-ray transmitting material and superimposed on one surface of the metal film, and with a space being formed between opposite parts of the first and second films, a laser beam is projected onto the part of the metal film which corresponds to the space, so that plasma is generated and confined in the space for a longer time than otherwise, thereby to increase the efficiency of X-ray generation.

17 Claims, 2 Drawing Sheets

METHOD AND APPARATUS FOR GENERATING X RAYS

BACKGROUND OF THE INVENTION

This invention relates to a method and apparatus for generating X rays by irradiating a target with a laser beam to produce plasma to emit X rays. The method and apparatus can be used in X-ray laser, X-ray lithography, X-ray microscopy, X-ray photoelectron spectrometric microscopy, etc.

In this type of apparatus for generating X rays, a plane or cylindrical member of a solid metal is used as a target, onto which a laser beam is projected to generate high-density plasma, which expands freely, and the X rays generated in the freely expanding plasma are taken out of the apparatus.

The above apparatus provided with a solid metal target has a disadvantage that since the high-density plasma produced on the target surface is instantly dissipated in the vacuum surrounding the target, the efficiency of X-ray generation cannot be increased.

SUMMARY OF THE INVENTION

Accordingly, the primary object of the invention is to provide a method and apparatus for generating X rays with its efficiency of X-ray generation increased by confining the plasma produced on a target by laser beam impingement thereon.

To attain the above object, in accordance with the invention, the target comprises a first film made of a solid metal and a second film made of a material transparent to X rays and superimposed on one surface of the first film. A space is formed between a part of the metal film and a corresponding part of the film transparent to X rays, and a laser beam is projected to that part of the metal film which corresponds to the space. The laser beam striking the surface of the metal film generates plasma, which is confined in the space between the two films for a certain period of time, though very short, so that the laser beam and the plasma interact with each other for a longer period of time than otherwise thereby to increase the efficiency of X-ray generation.

DESCRIPTION OF THE DRAWINGS

FIGS. 2(a) and (b) are views similar to FIG. 2(b) but showing different embodiments of the invention.

PREFERRED EMBODIMENT OF THE INVENTION

Figure 1:
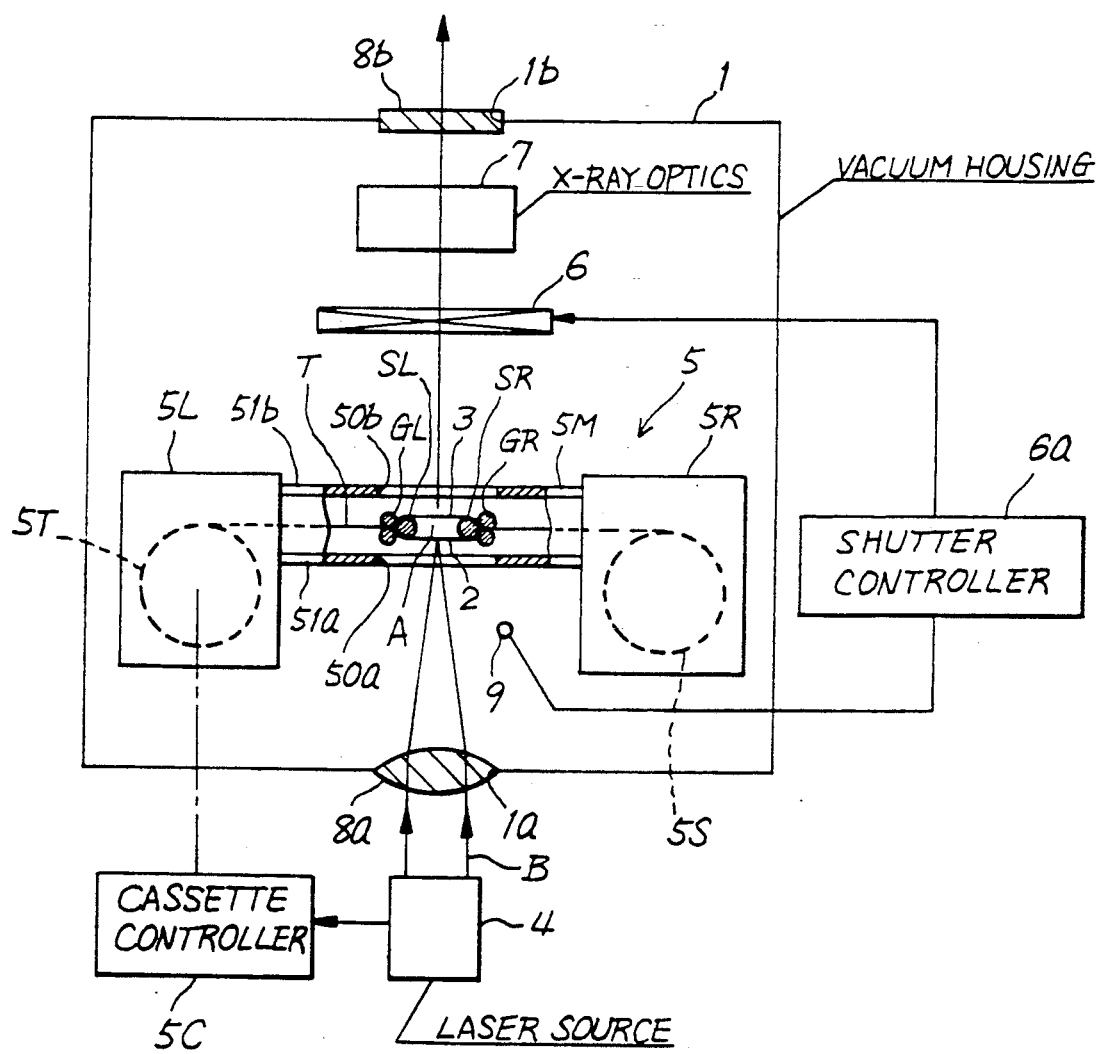
FIG. 1 is a schematic layout of one embodiment of the invention.

Referring to FIG. 1, there is shown a vacuum housing 1, in which a target tape cassette 5 is provided. The cassette 5 comprises a pair of lateral chambers 5L and 5R spaced a suitable distance from each other and a middle chamber 5M bridging and communicating with the lateral chambers 5L and 5R.

The cassette 5 contains a target, which is in the form of a double-layer tape T in the embodiment of FIGS. 1 and 2. The target tape T is wound on a supply reel 5S rotatably supported in one of the chambers, say, 5R and paid out of the reel 5S to extend flatly through the middle chamber 5M so as to be wound onto a take-up reel 5T rotatably supported in the opposite chamber 5L. The double-layer tape T comprises a first continuous component tape 2 made of a suitable metal such as Al, Au, or Ti and a second continuous component tape 3 made of a suitable material such as polyimide highly transparent to X rays and superimposed on the metal tape 2.

An opening 50a is formed in one wall 51a of the middle chamber 5M of the cassette 5 and a corresponding opening 50b is formed in the opposite wall 51b thereof.

In the middle chamber 5M of the cassette 5 there are provided a pair of parallel spacer rods SR and SL interposed between the two component tapes 2 and 3 of the double-layer tape T, and two pairs of guide rollers GR and GL between which the tape T passes. The two spacer rods SR and SL extend widthwise of the tape T and are spaced a suitable distance from each other lengthwise of the tape T, so that the spacer rods SR and SL keep the two component tapes 2 and 3 separated thereby to form a space A therebetween. The spacer rods SR and SL are of such a diameter that the space A formed is about 1 mm in height or thickness. As the tape 2 is intermittently fed longitudinally as will be described later, a new space A is successively formed between the two component tapes 2 and 3. The metal tape 2 may be, for example, 5 mm in width and 10 to 100 $\mu$m in thickness while the polyimide tape 3 may be, for example, 5 mm in width and 1 $\mu$m in thickness.

In the drawings, the dimensions of the tapes 2 and 3, the spacer rods SR and SL and the other members are shown not accurately but exaggerated for convenience and easiness of illustration.

An opening 1a is formed in one lateral wall of the vacuum housing 1 and a corresponding opening 1b is formed in the opposite lateral wall thereof. A convex lens 8a is airtightly fitted in the opening 1a and a plate 8b made of a material transparent to X rays is airtightly fitted in the opening 1b.

Outside the vacuum housing 1 there is provided a laser source 4 adjacent the lens 8a. The positions of the laser source 4, the lens 8a and the plate 8b of the housing 1 and the openings 50a and 50b of the middle chamber 5M of the cassette 5 are so determined that the laser beam B from the source 4 enters the vacuum housing 1 through the lens 8a and the opening 50a of the middle chamber 5M of the cassette 5 and is focused onto the metal tape 2 adjacent the space A, and that the X rays produced pass through the opposite opening 50b of the middle chamber 5M to emerge out of the vacuum housing 1 through the plate 8b.

Between the opening 50b of the middle chamber 5M of the cassette 5 and the plate 8b of the vacuum housing 1 there is provided a high-speed shutter 6, between which and the plate 8b there is further provided an X-ray optics 7 to obtain collimated X rays.

Adjacent the opening 50a of the middle chamber 5M of the cassette 5 there is provided an X-ray sensor 9, the output of which is applied to a shutter controller 6a which controls the operation of the high-speed shutter 6 in response to the output signal from the sensor 9 as will be described later in detail.

Each time the laser source 4 produces a laser pulse, a cassette controller 5c operates to drive the cassette 5 to feed the tape T by a predetermined length, say, 2 to 3 mm.

Figure 2A:
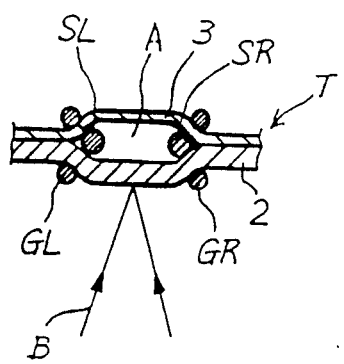
FIGS. 2(a) (b) and (c) are enlarged sectional views schematically showing different states of the target shown in FIG. 1 as it is bombarded by a laser beam.
Figure 2B:
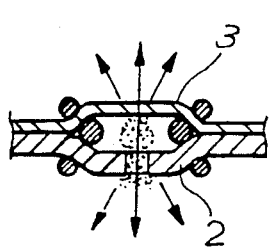
Figure 2C:
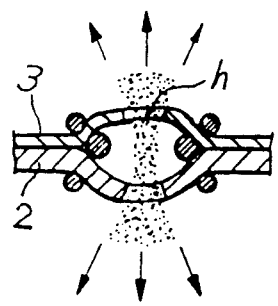

The operation of the apparatus will be described below with reference to FIGS. 2(a) through 2(c). As shown FIG. 2(a), when a laser beam B is focussed on the metal tape 2, the metal of the irradiated spot of the tape is evaporated to generate a high-temperature and high-density plasma, from which high-brightness X rays are emitted radially. Part of the emitted X rays pass the shutter 6 then open and the X-ray optics 7 to emerge out of the vacuum housing 1 through the X-ray transmitting plate 8b.

The plasma generated by the laser impingement on the metal tape 2 is confined in the space A between the metal tape 2 and the polyimide tape 3, though only for a short period of time, say, on the order of nanoseconds, so that the laser beam and the plasma interact with each other for a longer period of time than otherwise, with resulting improvement of the efficiency of X-ray generation. The particles of the plasma collide with the polyimide tape, so that the kinetic energy of the particles, that is, their speed is reduced, with a resulting advantage that it becomes easy to control the scattering particles and consequently collect them by using a vacuum pump.

The polyimide tape 3 must be as thin as possible, say, less than 1 $\mu$m thick in order to allow as large an amount of X rays as possible to be transmitted through the polyimide tape. The pressure of the high-density plasma generated in the space A by the laser impingement causes a hole h to be formed in the polyimide tape 3 as shown in FIG. 2(c), and the particles of the plasma pass through the hole h and are likely to fly as far as the X-ray optics 7 and/or the X-ray transmitting plate 8b to be attached thereto.

In order to enable confinement of the plasma in the space A as long as possible, the time from the laser beam impingement on the metal tape 2 to formation of the hole h in the polyimide tape 3 is preferably longer than the pulse width of the laser beam emitted by the source 4.

The high-speed shutter 6 is disposed in front of the X-ray optics 7 to reduce the adverse influence of the above-mentioned hole h in the polyimide tape 3. The shutter controller 6a controls the high-speed shutter 6 in such a manner that the shutter 6 is normally open and is closed for a predetermined period of time upon lapse of a predetermined period of time, say, 0.1 msec after detection of X rays by the X-ray sensor 9. Suppose that the high-speed shutter 6 is disposed 10 cm away from the position where X rays are generated, and that the particles of the plasma have their initial speed of $10^4$ m/sec reduced to $10^3$ m/sec due to collision with the polymide tape. It takes about 0.1 msec for the particles to fly through the hole h to reach the shutter 6. Therefore, if the shutter 6 is closed upon lapse of 0.1 msec after generation of X rays, the X rays can pass the shutter 6 while it remains open but the particles are blocked by the closed shutter 6 so as to prevent the X-ray optics 7 and/or the X-ray transmitting plate 8b from being stained with the particles.

The shutter 6 may be closed upon passage of 0.1 msec after the laser source 4 produced a pulse of laser beam.

In the above embodiment, a hole of 0.1 to 1 mm in diameter is formed by one shot of laser beam in both the metal tape 2 and the polyimide tape 3. By feeding the tape T by a length of 2 to 3 mm after irradiation with each laser pulse it is possible to successively supply a new area of the tape to the focal point of the laser beam thereby to produce X rays continuously for a long period of time.

When the whole tape T in the cassette has been used up, it can be exchanged for a new cassette by simple and easy operation. This is a practical advantage.

Figure 3A:
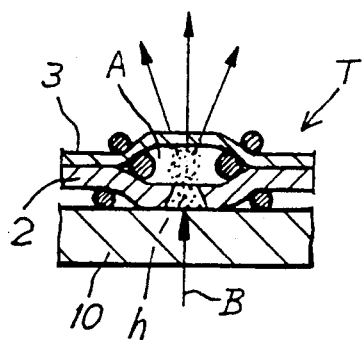

The time of confinement of the plasma may be lengthened by placing a plate 10 transparent to infrared radiation in contact with the front surface of the metal tape 2 in front of the space A as shown in FIG. 3(a). Even when a hole h is formed in the metal tape 2 by laser impingement thereon, the plate 10 helps to close the hole, though for a short period of time, thereby to confine the generated plasma in the space A for a longer period of time than in the embodiment of FIG. 2(a). The plate 10 may be several millimeters thick and is kept stationary, with the metal tape 2 in slidable contact with the plate 10 as the tape T is moved.

Figure 3B:
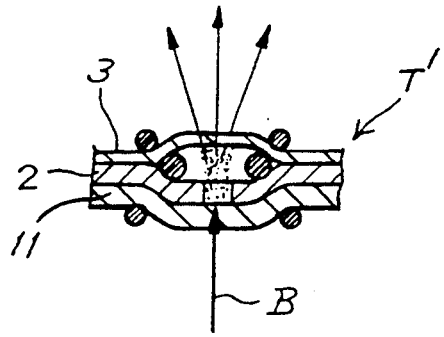

Instead of the double-layer tape T, a triple-layer tape T' as shown in FIG. 3(b) may also be used. The tape T' comprises a metal tape 2, a polyimide tape 3 at one surface of the metal tape 2, and a backup tape 11 about 1 mm thick and made of a suitable material transparent to infrared radiation, such as Mylar, at the opposite surface of the metal tape 2. The triple-layer structure helps to lengthen the time of confinement of plasma in the space A.

The metal tape may comprise a single film made of one or more kinds of metal, or a plurality of films each made of one or more kinds of metal.

Figure 4:
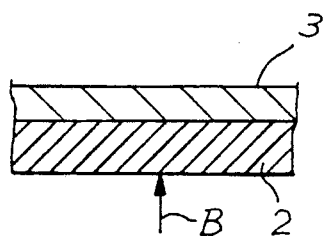
FIG. 4 is a schematic sectional view of the target in a still different embodiment of the invention.

In the previously described embodiments, the space-forming rods SR and SL are interposed between the metal tape 2 and the polyimide tape 3 so as to positively form a space A therebetween. In FIG. 4 the tape T which comprises a metal tape 2 and a polyimide tape 3 simply superimposed thereon is used without any space-forming means interposed therebetween. Upon impingement of a laser beam B on the metal tape 2, any bubles trapped between the metal tape 2 and the polyimide tape 3 are expanded by the heat caused by the laser impingement thereby to form a space between the two tapes, with resulting confinement of the generated plasma in the space, as in the previous embodiments.

In the previous embodiments, the high-speed shutter 6 is disposed in front of the X-ray optics 7 so as to prevent the scattering particles of the plasma from staining the optics 7. In an apparatus which is not provided with any X-ray optical elements and in which little consideration need be given to staining of the X-ray transmitting plate of the vacuum housing, no such high-speed shutter need be provided.

In accordance with the invention, on at least one surface of a metal film there is provided a film transparent to X-rays, with a space interposed between opposite parts of the two films, and a laser beam is projected onto the metal film at the position corresponding to the space, so that it is possible to confine the plasma generated by the laser beam impingement on the metal film in the space at a high temperature and density, though for a short period of time, thereby to increase the efficiency of X-ray generation. It is also possible to easily control the particles of the plasma thereby to raise the efficiency of collecting scattering particles by means of a vacuum pump.

What I claim:
1. A method of generating X rays, comprising:
   a) providing a target in a vacuum enclosure, said target comprising a first film made of a metal and a second film made of a material transparent to X rays superimposed on one surface of said metal film;

b) forming a space between opposite parts of said first and second films; and c) irradiating said part of said first film which corresponds to said space with a laser beam to generate in said space plasma to emit X rays.

2. The method of claim 1, wherein said first film is in the form of a first continuous component tape and said second film is in the form of a second continuous component tape superimposed on one surface of said first component tape to form a double-layer tape.

3. The method of claim 2, wherein said first continuous component tape comprises a single film made of at least one kind of metal selected from a group consisting of Al, Au and Ti, and said second continuous component tape comprises a film made of polyimide.

4. The method of claim 2, wherein said first continuous component tape comprises a plurality of films each made of at least one kind of metal selected from a group consisting of Al, Au and Ti, and said second continuous component tape comprises a film made of polyimide.

5. The method of claim 2, wherein said target further includes a third continuous component tape comprising a film made of a material transparent to infrared radiation and superimposed on that surface of said first continuous component tape opposite to that on which said second continuous component tape is superimposed, so that said first, second and third component tapes form a triple-layer tape.

6. The method of claim 1, further comprising:

d) providing a plate made of a material transparent to infrared radiation at the side of said first film opposite to said one surface thereof and in contact with said part of said first film which corresponds to said space.

7. The method of claim 1, wherein said space is formed by space forming means interposed between said first and second films.

8. The method of claim 2, wherein said laser beam is pulsed, and said double-layer tape is longitudinally fed intermittently after generation of each pulse of said laser beam so that X rays are generated continuously.

9. The method of claim 5, wherein said laser beam is pulsed, and said triple-layer tape is longitudinally fed intermittently after generation of each pulse of said laser beam so that X rays are generated continuously.

10. An apparatus for generating X rays, comprising:

a) a vacuum housing provided with a first window and a second window;

b) a target cassette enclosed in said vacuum housing and enclosing a target tape wound on a supply reel so as to be paid out therefrom and extend flatly a predetermined length so as to be wound onto a take-up reel, said target tape comprising a first continuous component tape made of a metal and a second continuous component tape made of a material transparent to X rays and superimposed on one surface of said first component tape;

c) means interposed between said first and second continuous component tapes in said flatly extending portions thereof for separating said first and second component tapes to form a space therebetween;

d) a laser source provided adjacent said first window of said vacuum housing for generating a laser beam to be projected through said first window to impinge on said flatly extending portion of said first component metal tape corresponding to said space thereby to generate plasma and X rays in said space;

e) X-ray optical means provided between said target tape cassette and said second widow of said vacuum housing for directing said X rays to emerge out of said vacuum housing through said second window; and f) means for driving said target tape cassette to feed said target tape a predetermined length after said laser beam impingement.

11. The apparatus of claim 10, further including:

g) a shutter provided between said target tape cassette and said X-ray optical means; and h) control means for closing said shutter to prevent the particles of said plasma from reaching said X-ray optical means and said second window of said vacuum housing.

12. The apparatus of claim 11, wherein said control means operates to close said shutter for a predetermined period of time a predetermined period of time after emission of a laser beam by said laser source.

13. The apparatus of claim 11, wherein said control means operates to close said shutter for a predetermined period of time a predetermined period of time after generation of X rays.

14. The apparatus of claim 10, wherein said first continuous component tape comprises a single film made of at least one kind of metal selected from a group consisting of Al, Au and Ti, and said second continuous component tape comprises a film made of polyimide.

15. The apparatus of claim 10, wherein said first continuous component tape comprises a plurality of films each made of at least one kind of metal selected from a group consisting of Al, Au and Ti, and said second continuous component tape comprises a film made of polyimide.

16. The apparatus of claim 10, wherein said target tape further comprises a third continuous component tape made of a material transparent to infrared radiation and superimposed on that surface of said first continuous component tape opposite to that on which said second continuous component tape is superimposed, so that said first, second and third component tapes form a triple-layer tape.

17. The apparatus of claim 10, further including:

i) a plate made of a material transparent to infrared radiation provided at the side of said first film opposite to said one surface thereof and in contact with said part of said first film which corresponds to said space.

* * * * *